United States Patent [19]

Miyake et al.

[11] 4,352,027

[45] Sep. 28, 1982

[54] SHIFT REGISTER

[75] Inventors: Masayuki Miyake; Takeo Sekino; Masashi Takeda, all of Tokyo, Japan

[73] Assignee: Sony Corporation, Tokyo, Japan

[21] Appl. No.: 156,209

[22] Filed: Jun. 3, 1980

[30] Foreign Application Priority Data

Jun. 5, 1979 [JP] Japan .................................. 54/70300

[51] Int. Cl.³ .......................................... G11C 19/28
[52] U.S. Cl. .............................. 307/221 R; 307/299 B
[58] Field of Search ........................ 307/221 R, 299 B; 328/37

[56] References Cited

U.S. PATENT DOCUMENTS

| 3,041,476 | 6/1962 | Parker | 307/221 R |
| 3,300,724 | 1/1967 | Cutaia | 328/37 |
| 3,636,376 | 1/1972 | Hoffmann | 328/37 |

*Primary Examiner*—John S. Heyman
*Attorney, Agent, or Firm*—Hill, Van Santen, Steadman, Chiara & Simpson

[57] ABSTRACT

A shift register having a plurality of flip-flop circuits connected in cascade in which a clock pulse is supplied to the flip-flop circuit at the final stage and the AND-outputs from the respective stage of flip-flop circuits are supplied to the preceding stage of flip-flop circuits as clock pulses, whereby the input data are shifted or transferred in synchronism with the clock pulse.

2 Claims, 19 Drawing Figures

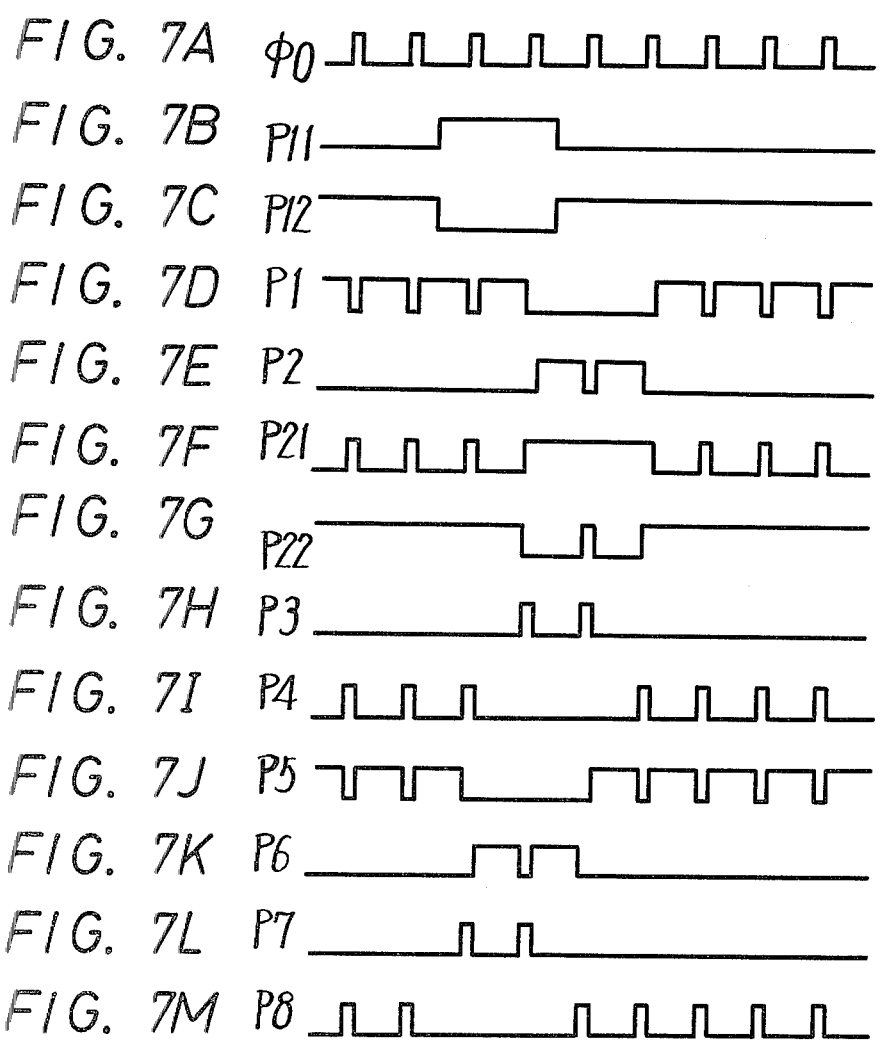

SHIFT REGISTER

BACKGROUND OF THE INVENTION

1. Field of the Invention

The present invention relates generally to a shift register, and is directed more particularly to a shift register formed of an IIL (integrated injection logic) or MTL (merged transistor logic).

2. Description of the Prior Art

A prior art IIL is fundamentally formed as shown in FIG. 1. In FIG. 1, N0 designates, for example, an N-conductivity type semiconductor substrate, P1 and P2 P-conductivity type regions, which are respectively formed on one of the major surfaces of substrate N0, and N1 to N3 N-conductivity type regions which are respectively formed in the region P2. Electrodes (terminals) I, B and C1 to C3 are connected to the regions P1, P2 and N1 to N3, respectively.

In the IIL shown in FIG. 1, the region P1-substrate N0-region P2 form a transistor Q1 as shown in FIG. 2, and the substrate N0-region P2-regions N1 to N3 form an NPN-type transistor Q2 of a multi-collector type as shown in FIG. 2. In this case, both transistors Q1 and Q2 are connected with each other as shown in FIG. 2.

With the IIL shown in FIG. 1 or FIG. 2, when a voltage $+V_{EE}$ is applied to the electrode I, the transistor Q1 operates as a constant current bias source. Therefore, the transistor Q2 operates as an inverter of an open-collector type. Further, when the voltage $+V_{EE}$ applied to the electrode I is turned ON and OFF, the transistor Q2 operates as a gate.

In the following description, the IIL described above will be symbolized as shown in FIG. 3 for the sake of brevity.

In the case where the above IILs are used to make a shift register of the synchronous type in the art, if the shift register is of the 2-phase clock type, the IILs are made as an IC (integrated circuit) with the connection shown in FIG. 4, while if the shift register is of the single-phase type, the IILs are made as an IC with the connection shown in FIG. 5. Each of FIGS. 4 and 5 shows a shift register of 2-bits.

The prior art shift register shown in FIG. 4 requires ten IILs for 1 bit, and the shift register shown in FIG. 5 requires seven IILs for 1 bit. Therefore, the areas of both chips forming the shift registers shown in FIGS. 4 and 5 will large, which is disadvantageous for making them as an IC.

Further, it is necessary for both prior art shift registers to supply a clock pulse to each of the bits, so that a complicated wiring pattern is required in each of the shift registers, which results in that the integration ratio deteriorates and hence both the shift registers result in disadvantages when made into an IC.

Also, it is required that each of clock pulse sources drives each of the bits in the shift register.

OBJECTS AND SUMMARY OF THE INVENTION

Accordingly, an object of the present invention is to provide a shift register free of the defects inherent to the prior art shift register.

Another object of the invention is for provide a shift register suitable to being made as an IC.

A further object of the invention is to provide a shift register in which the clock pulse can be selected to be small in amplitude.

According to an aspect of the present invention, a shift register is provided which comprises; a plurality of flip-flop stages connected in series; a means for supplying clock pulses to the last stage; and a means for applying an AND output of each stage to its preceding stage as a clock signal, whereby input data are transferred according to clock states in said stages.

The other objects, features and advantages of the present invention will become apparent from the following description taken in conjunction with the accompanying drawings.

BRIEF DESCRIPTION OF THE DRAWINGS

FIGS. 7A to 7M are waveform diagrams used for the explanation of the operation of the example shown in FIG. 6.

DESCRIPTION OF THE PREFERRED EMBODIMENT

An example of the shift register according to the present invention will be hereinafter described with reference to FIGS. 6 and 7A to 7M.

Figure 1:
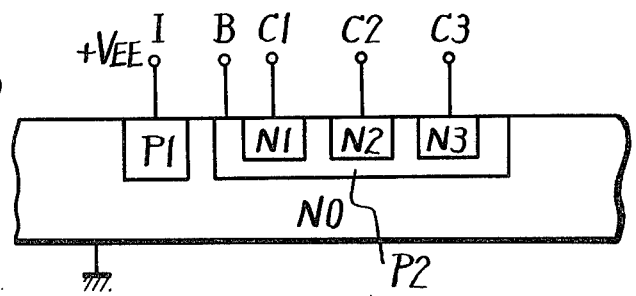
FIG. 1 is a cross-sectional view showing a prior art IIL.
Figure 2:
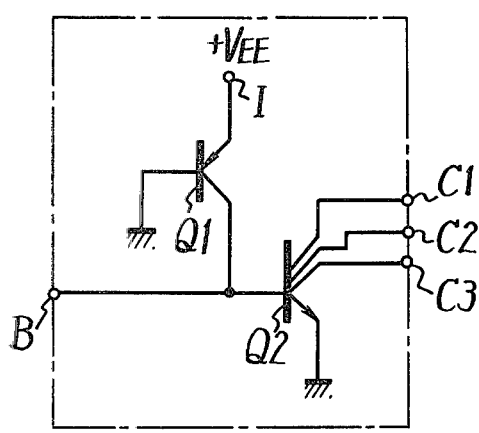
FIG. 2 is an equivalent circuit diagram of the IIL shown in FIG. 1.
Figure 3:
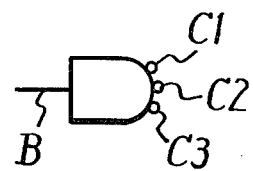
FIG. 3 is a symbol representing the IIL shown in FIG. 1 or 2.
Figure 5:
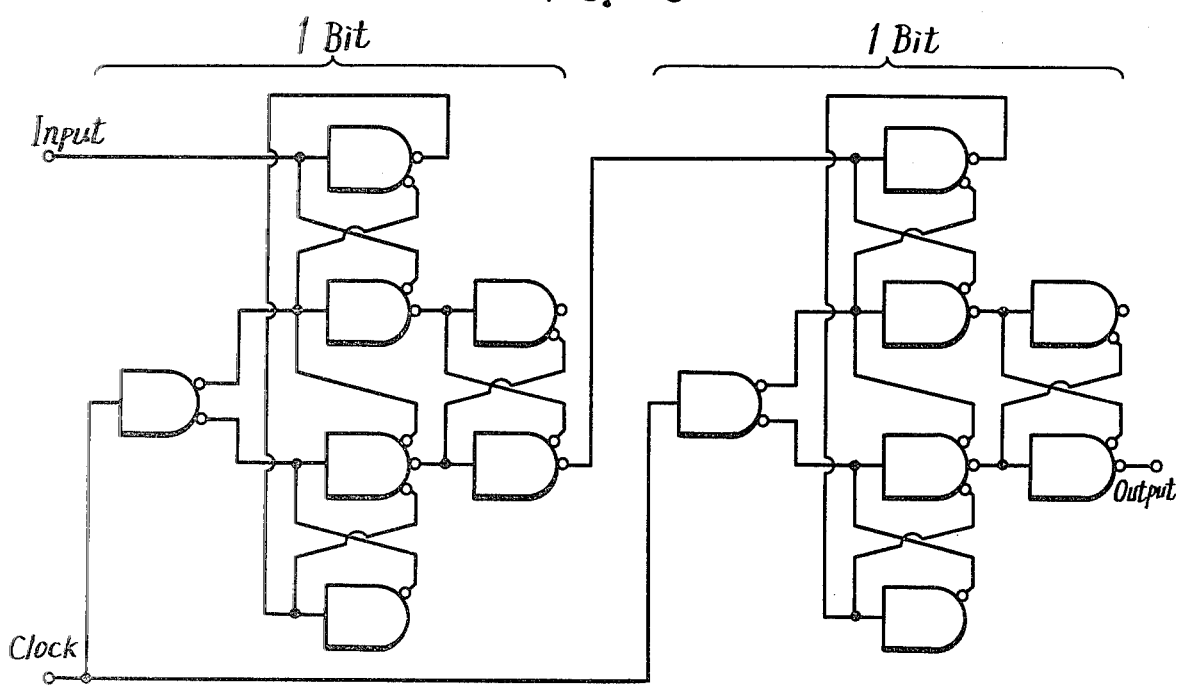
FIGS. 4 and 5 are connection diagrams respectively showing prior art shift registers using the IILs.
Figure 6:
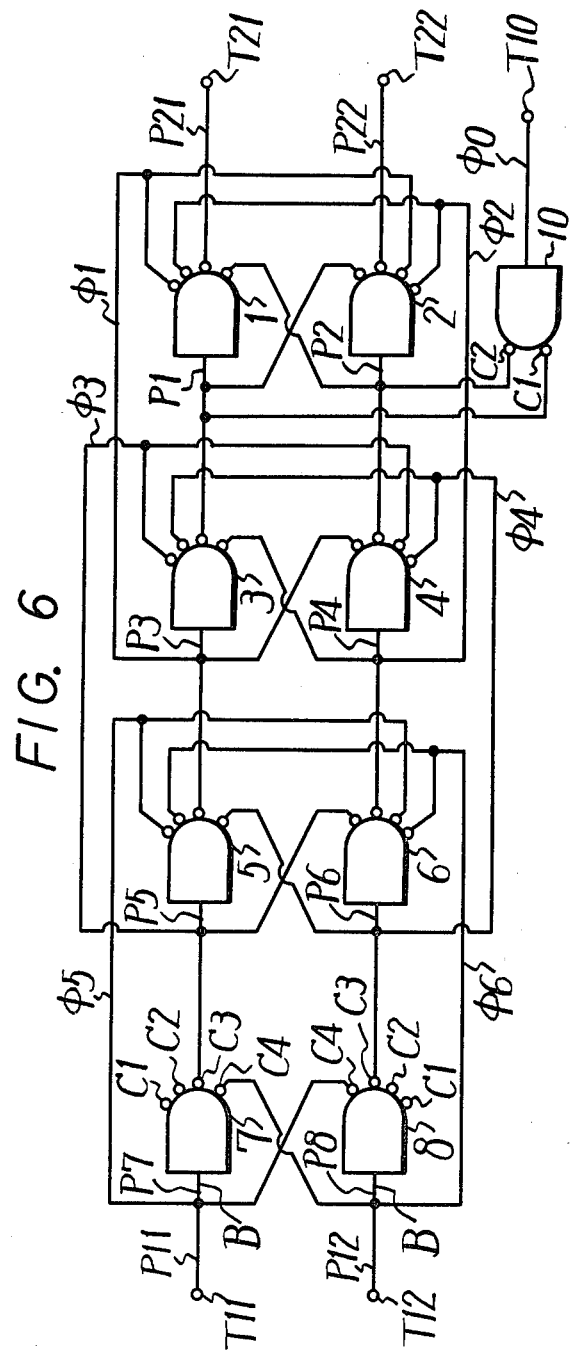
FIG. 6 is a connection diagram showing an example of the shift register according to the present invention in which the IILs are used.

FIG. 6 shows an example of the shift register according to the present invention, which is of the 2-bit type, by way of example. In FIG. 6, 1 to 8 designate IILs, each being the same as that shown in FIGS. 1 to 3. In the example of the invention shown in FIG. 6, IILs 1 and 2; 3 and 4; 5 and 6; and 7 and 8 comprise four IIL set, respectively. In each of the IIL sets, the electrode B or base of one IIL is connected to the electrode C4 or collector of the other IIL to form a flip-flop circuit. Further, the IILs 7, 5, 3 and 1 are connected in cascade between an input terminal T11 and an output terminal T21. That is the base B of IIL 7 is connected to the input terminal T11, the collector C3 thereof is connected to the base B of IIL 5, its collector C3 is connected to the base B of IIL 3, its collector C3 is connected to the base B of IIL 1 and its collector C3 is connected to the output terminal T21. Similarly, the base B to the collector C3 of IILs 8, 6, 4 and 2 are connected in cascade between another input terminal T12 and another output terminal T22.

An IIL 10 is also provided which has a base B connected to a clock input terminal T10 and collectors C1 and C2 respectively connected to the bases B of IILs 1 and 2 at the last stage. The collector C1 of one of IILs of each set except the IIL sets 7 and 8 of first stage is connected to the collector C2 of the other IIL, and the collector C2 of one IIL is connected to the collector C1 of the other IIL to form a wired AND circuit. The connection points between the collectors C1 and C2 are connected to the bases B of IILs of the preceding stage, respectively. The clock terminal T10 is supplied with a clock pulse $\phi 0$ shown in, for example, FIG. 7A. The circuit consisting of IILs 1 to 8 and 10 shown in FIG. 6 is made as an IC of one chip.

Now, a description will be given of the operation of the shift register shown in FIG. 6. For example, pulses P11 and P12, which are inverse in phase as shown in FIGS. 7B and 7C, are supplied to the input terminals T11 and T12. Waveforms P1 to P8 occurs at the bases B of IILs 1 to 8 and outputs P21 and P22 occurs at the output terminals T21 and T22 and are respectively varied as shown in FIGS. 7D, 7E, 7H to 7M and FIGS. 7F and 7G. In detail, when the clock pulse $\phi 0$ becomes high level, the output from IIL 10 becomes low level. Therefore, the IILs 1 and 2 respectively stop their data acceptance from the preceding stages and their outputs become high level. Thus, AND-outputs $\phi 1$ and $\phi 2$ from IILs 1 and 2 become high level, which are in turn fed to IILs 3 and 4 as clock pulses, respectively, so that IILs 3 and 4 accept the data from the preceding stages, respectively, and their outputs become the levels corresponding to the accepted data. At this time, AND-outputs $\phi 3$ and $\phi 4$ from IILs 3 and 4 become low level and they are fed to IILs 5 and 6 as clock pulses, so that IILs 5 and 6 stop data acceptance from the preceding stages and hence their outputs become high level. Thus, AND-outputs $\phi 5$ and $\phi 6$ from IILs 5 and 6 become high level and, are supplied to IILs 7 and 8 as clock pulses, so that IILs 7 and 8 accept the data at the input terminals T11 and T12, respectively, and their outputs become level corresponding to the accepted data.

On the contrary, when the clock pulse $\phi 0$ has a low level, the outputs from IIL 10 will have a high level. Therefore, the IILs 1 and 2 take in the data from the preceding stages and deliver the same to the output terminals T21 and T22, respectively. At this time, the AND-outputs $\phi 1$ and $\phi 2$ from IILs 1 and 2 become low level and are fed to IILs 3 and 4, so that the IILs 3 and 4 stop data acceptance from the preceding stages and their outputs become high level. Thus, the AND-outputs $\phi 3$ and $\phi 4$ from IILs 3 and 4 become high level. Since the AND-outputs $\phi 3$ and $\phi 4$ of high level are fed to IILs 5 and 6, the IILs 5 and 6 accept the data from the preceding stages. At this time, the AND-outputs $\phi 5$ and $\phi 6$ become low level and are fed to IILs 7 and 8, so that the IILs 7 and 8 stop their data acceptance from the input terminals T11 and T12.

The above two operations will be repeated every time that the level of clock pulse $\phi 0$ is changed so that the data i.e. input pulses P11 and P12 are shifted or transferred one bit by one bit.

Figure 4:
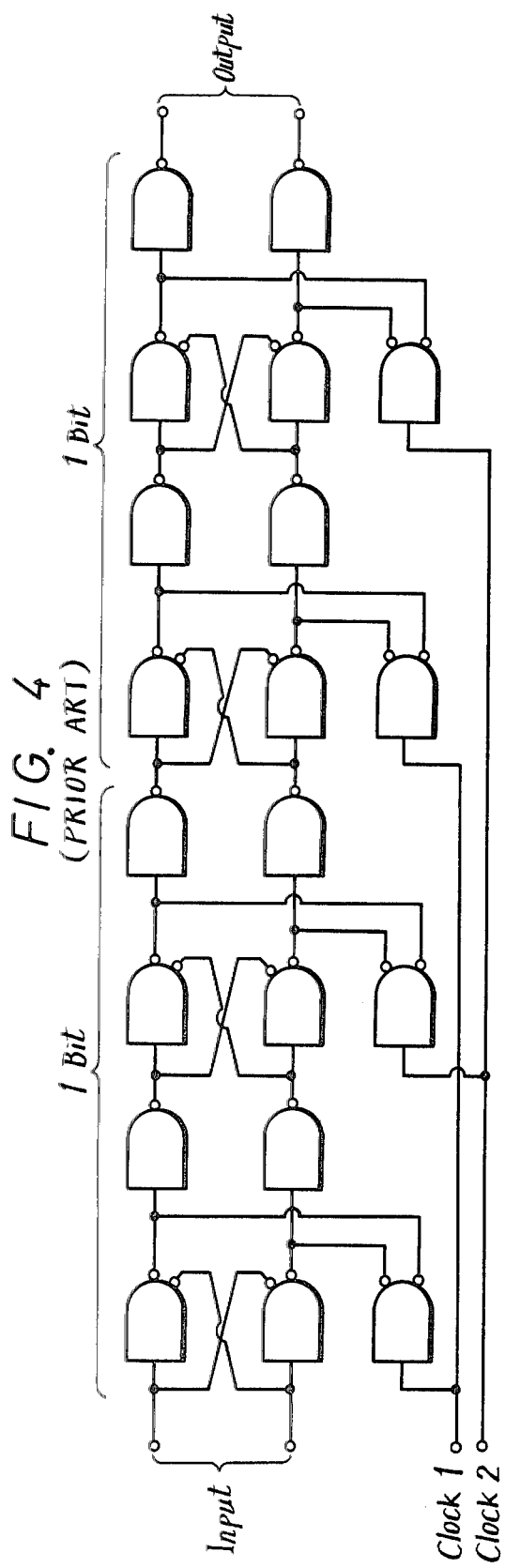

According to the shift register of the non-synchronous type of the present invention made as described above, the number of the IILs can be reduced by about ½ as compared with that of the prior art shift register shown in FIG. 4 or FIG. 5 and hence the area of the chip, in which the shift register is formed, can be reduced. That is, the shift register of this invention is advantageous when it is made as an IC.

Further, according to the present invention, it is sufficient that the clock pulse $\phi 0$ be supplied to the IIL in the last stage and it is needless to supply the clock pulse $\phi 0$ to the other IILs, so that the wiring for the latter becomes unnecessary, which means that the shift register of the invention will be advantageous when it is made as an IC.

Also, according to the invention, it is sufficient to supply the clock pulse $\phi 0$ to the last stage IIL regardless of the number of IILs, so that the driving ability of the clock pulse can be selected to be small and hence the construction becomes simple.

Although the above description is given on a single preferred embodiment of the present invention, it will be apparent that many modifications and variations could be effected by one skilled in the art without departing from the spirits or scope of the novel concepts of the invention.

We claim as our invention:

1. A shift register comprising: a plurality of flip-flop stages connected in series, a means for supplying clock pulses to the last stage; and a means for applying an AND output of each stage to its preceding stage as a clock signal whereby input data are transferred according to clock states at said stages, in which at least one stage has a pair of gates each having at least four output terminals, one is connected to an input terminal of the pair gate, another to an input terminal of a gate in a following stage, the other two to input terminals of gates in a preceding stage with output terminals of said pairs of gates constituting AND circuits, respectively, to convey said clock pulses in the reverse direction.

2. A shift register comprising a plurality of logic circuits having an input terminal and four output terminals, each formed of a pair of transistors, a first plurality of said logic circuits connected in series, a second plurality of said logic circuits connected in series, respective pairs of said first and second plurality of logic circuits interconnected to form a plurality of flip-flop circuits, a pair of input terminals connected to the input terminals of a first pair of said first and second plurality of logic circuits, a pair of output terminals connected to the last pair of said first and second plurality of logic circuits, and means for supplying clock pulses only to said last pair of said first and second plurality of logic circuits, and said second through last pairs of said first and second plurality of logic circuits supplying outputs to the preceeding pair of said logic circuits.

* * * * *